US010810114B2

(12) United States Patent
Dickie et al.

(10) Patent No.: US 10,810,114 B2
(45) Date of Patent: Oct. 20, 2020

(54) TESTING AUTONOMOUS RECONFIGURATION LOGIC FOR AN ELECTROMECHANICAL ACTUATOR

(71) Applicant: Hamilton Sundstrand Corporation, Charlotte, NC (US)

(72) Inventors: David F. Dickie, Bloomfield, CT (US); Steven A. Avritch, Bristol, CT (US); Peter E. Gardow, Wethersfield, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 219 days.

(21) Appl. No.: 15/943,626

(22) Filed: Apr. 2, 2018

(65) Prior Publication Data
US 2019/0303278 A1  Oct. 3, 2019

(51) Int. Cl.
*G06F 11/00* (2006.01)
*G06F 11/36* (2006.01)
*G01R 31/3185* (2006.01)
*G05B 23/02* (2006.01)

(52) U.S. Cl.
CPC .. *G06F 11/3692* (2013.01); *G01R 31/318519* (2013.01); *G05B 23/0256* (2013.01); *G06F 11/3688* (2013.01)

(58) Field of Classification Search
CPC ............. G06F 11/3692; G06F 11/3688; G05B 23/0256; G01R 31/318519
USPC ....................................................... 714/38.1
See application file for complete search history.

(56) References Cited

U.S. PATENT DOCUMENTS

| 4,472,780 | A | 9/1984 | Chenoweth et al. | |
|---|---|---|---|---|
| 5,987,244 | A * | 11/1999 | Kau | G06F 1/04 713/500 |
| 8,761,993 | B2 | 6/2014 | Ric et al. | |
| 9,002,541 | B2 | 4/2015 | Fezzazi et al. | |
| 9,557,363 | B2 | 1/2017 | Ouderkirk et al. | |
| 2007/0234300 | A1* | 10/2007 | Leake | G06F 8/51 717/124 |
| 2008/0297120 | A1* | 12/2008 | Potter | B64G 1/426 322/4 |

(Continued)

FOREIGN PATENT DOCUMENTS

EP  2444870 A2  4/2012

OTHER PUBLICATIONS

Extended European Search Report for European Patent Application No. EP19166812.8, dated Jul. 24, 2019.

*Primary Examiner* — Yair Leibovich
(74) *Attorney, Agent, or Firm* — Locke Lord LLP; Scott D. Wofsy; Judy R. Naamat (57) ABSTRACT

A method for testing autonomous reconfiguration logic for an electromechanical actuator includes executing a plurality of test cases against a computer model configured and operable to implement autonomous reconfiguration logic for an electromechanical actuator including a plurality of electromechanical motors to generate a first set of test results. The method further includes executing the plurality of test cases against a programmable logic device configured and operable to implement the autonomous reconfiguration logic for the electromechanical actuator to generate a second set of test results and comparing the first set of test results to the second set of test results.

18 Claims, 8 Drawing Sheets

(56) References Cited

U.S. PATENT DOCUMENTS

| | | | |
|---|---|---|---|
| 2008/0309261 A1* | 12/2008 | Anson | F02C 7/232 |
| | | | 318/53 |
| 2015/0100282 A1* | 4/2015 | Shokooh | G06F 17/5009 |
| | | | 703/2 |
| 2016/0068256 A1 | 3/2016 | Neely et al. | |
| 2019/0233087 A1* | 8/2019 | Avritch | G05D 1/0088 |

* cited by examiner

TESTING AUTONOMOUS RECONFIGURATION LOGIC FOR AN ELECTROMECHANICAL ACTUATOR

FIELD OF THE INVENTION

The present disclosure relates to actuators, and more particularly to verification of complex autonomous reconfiguration logic of a multi-redundant actuator control system.

BACKGROUND OF THE INVENTION

Vehicles like aircraft commonly include fly-by-wire flight control systems. Such systems typically include a plurality of actuators that move various flight control surfaces as commanded by a plurality of flight control computers. In safety critical aircraft flight control systems, typically at least triplex redundancy is required so that in case any one, or two of the command paths fail, the aircraft will remain under control. Modern improved smart actuators have the ability to operate autonomously. These modern smart actuators are capable of independently tolerating system faults and command outages (that could be caused by flight control computer resets, for example). More specifically, improved actuator systems and methods include a complete set of robust reconfiguring mode logic algorithms to ensure that actuators continuously monitor their status and that they are capable of autonomously configuring their power and movement to the best possible control state without the flight control computer supervision or intervention.

Thus, there is a need in the art for performing a robustness testing of complex autonomous reconfiguration logic of a multi-redundant electromechanical actuator in an optimal, repeatable and timely fashion. The present disclosure provides a solution for this need.

SUMMARY OF THE INVENTION

The purpose and advantages of the illustrated embodiments will be set forth in and apparent from the description that follows. Additional advantages of the illustrated embodiments will be realized and attained by the devices, systems and methods particularly pointed out in the written description and claims hereof, as well as from the appended drawings.

In accordance with a purpose of the illustrated embodiments, in one aspect, a method for testing autonomous reconfiguration logic for an electromechanical actuator includes executing a plurality of test cases against a computer model configured and operable to implement autonomous reconfiguration logic for an electromechanical actuator including a plurality of electromechanical motors to generate a first set of test results. The method further includes executing the plurality of test cases against a programmable logic device configured and operable to implement the autonomous reconfiguration logic for the electromechanical actuator to generate a second set of test results and comparing the first set of test results to the second set of test results.

In another aspect, a system for testing autonomous reconfiguration logic for an electromechanical actuator includes a computer model configured and operable to implement autonomous reconfiguration logic for an electromechanical actuator comprising a plurality of electromechanical motors. The system further includes a programmable logic device configured and operable to implement the autonomous reconfiguration logic for the electromechanical actuator. The system also includes a processor communicatively coupled to the computer model and the programmable logic device. The processor is configured and operable to execute a plurality of test cases against the computer model to generate a first set of test results and execute the plurality of test cases against the programmable logic device to generate a second set of test results. The processor is further configured to compare the first set of test results to the second set of test results.

BRIEF DESCRIPTION OF THE DRAWINGS

The accompanying appendices and/or drawings illustrate various, non-limiting, examples, inventive aspects in accordance with the present disclosure.

DETAILED DESCRIPTION OF CERTAIN EMBODIMENTS

The present invention is now described more fully with reference to the accompanying drawings, in which illustrated embodiments of the present invention are shown wherein like reference numerals identify like elements. The present invention is not limited in any way to the illustrated embodiments as the illustrated embodiments described below are merely exemplary of the invention, which can be embodied in various forms, as appreciated by one skilled in the art. Therefore, it is to be understood that any structural and functional details disclosed herein are not to be interpreted as limiting, but merely as a basis for the claims and as a representative for teaching one skilled in the art to variously employ the present invention. Furthermore, the terms and phrases used herein are not intended to be limiting but rather to provide an understandable description of the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, exemplary methods and materials are now described. It must be noted that as used herein and in the appended claims, the singular forms "a", "an," and "the" include plural referents unless the context clearly dictates otherwise. Thus, for example, reference to "a stimulus" includes a plurality of such stimuli and reference to "the signal" includes reference to one or more signals and equivalents thereof known to those skilled in the art, and so forth.

Implementation of the techniques, blocks, steps and means described below may be done in various ways. For example, these techniques, blocks, steps and means may be implemented in hardware, software, or a combination thereof. For a hardware implementation, the processing units may be implemented within one or more application specific integrated circuits (ASICs), digital signal processors (DSPs), digital signal processing devices (DSPDs), programmable logic devices (PLDs), field-programmable gate arrays (FPGAs), soft core processors, hard core processors, controllers, micro-controllers, microprocessors, other electronic units designed to perform the functions described above, and/or a combination thereof. Software can be used instead of or in addition to hardware to perform the techniques, blocks, steps and means.

As used herein, the term "software" is meant to be synonymous with any code or program that can be in a processor of a host computer, regardless of whether the implementation is in hardware, firmware or as a software computer product available on a disc, a memory storage device, or for download from a remote machine. The embodiments described herein include such software to implement the equations, relationships and algorithms described below. One skilled in the art will appreciate further features and advantages of the invention based on the below-described embodiments. Accordingly, the invention is not to be limited by what has been particularly shown and described, except as indicated by the appended claims.

In exemplary embodiments, a computer system component may constitute a "module" that is configured and operates to perform certain operations as described herein below. Accordingly, the term "module" should be understood to encompass a tangible entity, be that an entity that is physically constructed, permanently configured (e.g., hardwired) or temporarily configured (e.g. programmed) to operate in a certain manner and to perform certain operations described herein.

Embodiments of the present invention are directed to a multi-redundant actuator. Behaviors that characterize the operational mode of the vehicle are associated with the actuators. A complete fly-by-wire flight control system typically controls multiple independent surfaces (for example, left and right ailerons). The system includes independent actuators for each surface. Multiple electromechanical motors may drive a single actuator (redundant drive mechanism). More specifically, the electromechanical motors, operating in conjunction with one another, drive the specific flight surface they are tasked with driving. In various embodiments multiple electromechanical motors that are driving one flight control surface interact with each other and autonomously configure themselves based on current operating conditions. Each of the actuators contains control logic that monitors inputs and fault status and properly configures all the redundant electromechanical motors to the optimal control state (mode of operation). The redundant control electromechanical motors communicate with each other to determine which one is in control (master mode) and which ones slave to the master (slave mode). Advantageously, embodiments of the present invention provide a testing framework and methodology capable of performing a plurality of comprehensive fully automated test cases to verify the proper functionality and timing of autonomous reconfiguration logic implemented by the multi-redundant actuators. The testing framework can be easily reconfigured when one or more test inputs are added, removed or changed. According to embodiments of the present invention, the disclosed testing framework is capable of testing substantially all execution paths through the autonomous reconfiguration logic to ensure that desired functionality performs as expected even in corner cases and other potential failure scenarios. Advantageously, the disclosed testing framework reduces time spent by users to analyze systems performance, while increasing repeatability, by automatically generating and executing test cases and by analyzing test output data associated with various functions of the autonomous reconfiguration logic under test.

Figure 1:
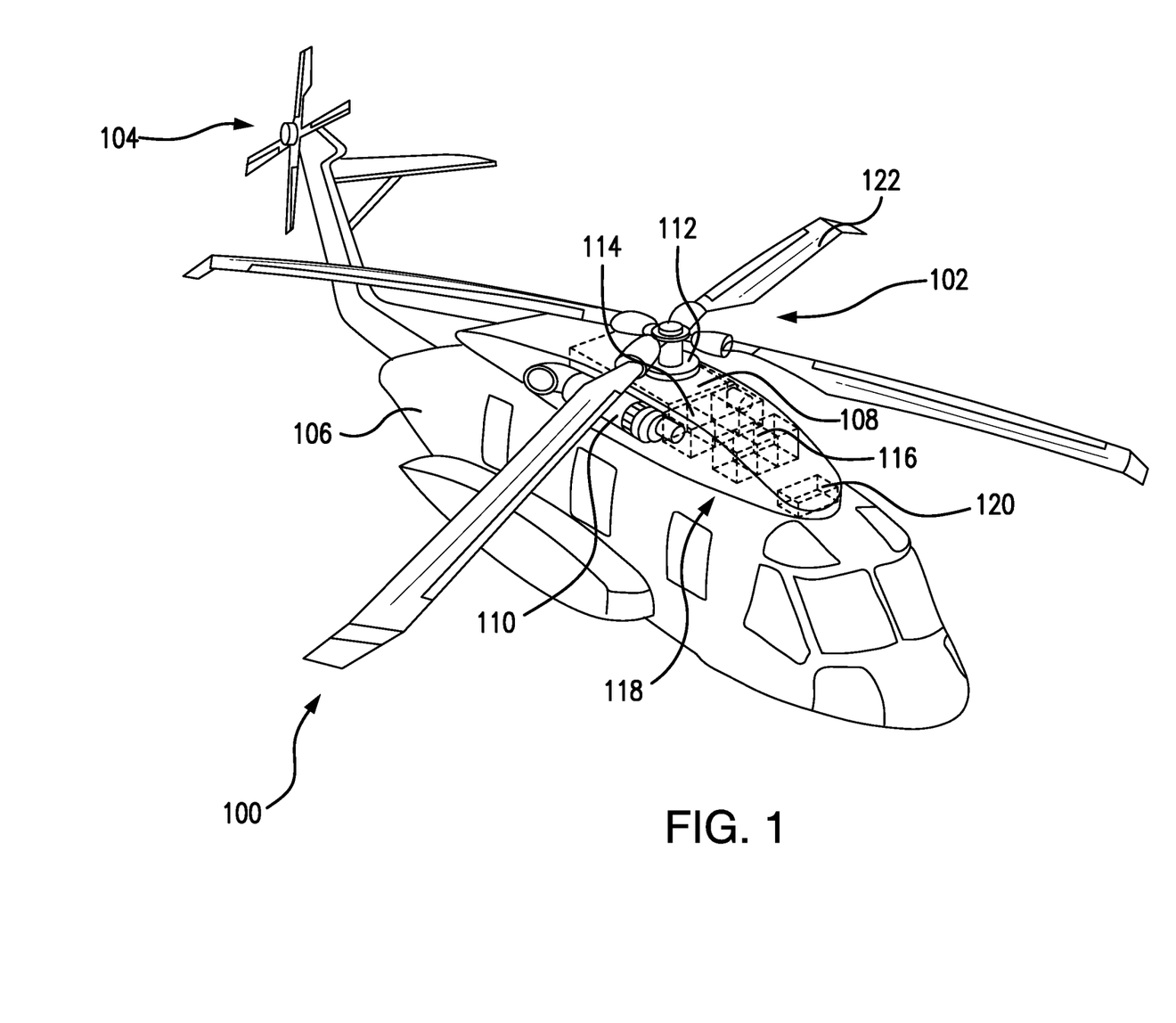
FIG. 1 is a schematic view of an exemplary embodiment of a vertical take-off and landing (VTOL) aircraft constructed in accordance with the present disclosure, showing actuators operatively connected to hydraulic systems and a flight control computer.

Reference will now be made to the drawings wherein like reference numerals identify similar structural features or aspects of the subject disclosure. For purposes of explanation and illustration, and not limitation, a partial view of an exemplary embodiment of an aircraft, here, an exemplary embodiment of an aircraft as a vertical takeoff and landing (VTOL) aircraft in accordance with the disclosure is shown in FIG. 1 and is designated generally by reference character 100. Other embodiments of aircraft in accordance with the disclosure, or aspects thereof, are provided in FIGS. 2-3, as will be described. The systems and methods described herein provide testing framework for increased reliability multi-redundant actuators that can be used in fly-by-wire systems.

As shown in FIG. 1, VTOL aircraft 100 includes a main rotor system 102 and tail rotor system 104 supported by an airframe 106. Airframe 106 includes a gearbox 108 interconnecting an engine 110 with main rotor system 102 and tail rotor system 104. Main rotor system 102 is operatively connected to a swash plate 112. Swash plate 112 is operatively connected to hydraulic systems 114. VTOL aircraft 100 includes linear actuators 116, e.g. electromechanical actuators, operatively connected to the hydraulic systems 114, for example, a mechanical hydraulic servoactuator. Although a particular VTOL aircraft configuration is illustrated and described in the disclosed embodiment, other configurations and/or machines, such as fixed wing aircraft, high speed compound rotary wing aircraft with supplemental translational thrust systems, dual contra-rotating, coaxial rotor system aircraft, turbo-props, tilt-rotors and tilt-wing aircraft, will also benefit from the present invention.

Although the fly-by-wire system 118 illustrated in FIG. 1 includes three actuators 116, other numbers of actuators may be used in other exemplary embodiments. System 118 includes a flight control computer 120 operatively connected to each of electromechanical motors 306. Each actuator 116 of system 118 is operatively connected to a respective one of hydraulic systems 114. System 118 includes a flight control surface 122 of a rotorcraft, e.g. VTOL aircraft 100, operatively connected to at least one of three hydraulic systems 114 through swash plate 112.

Figure 2:
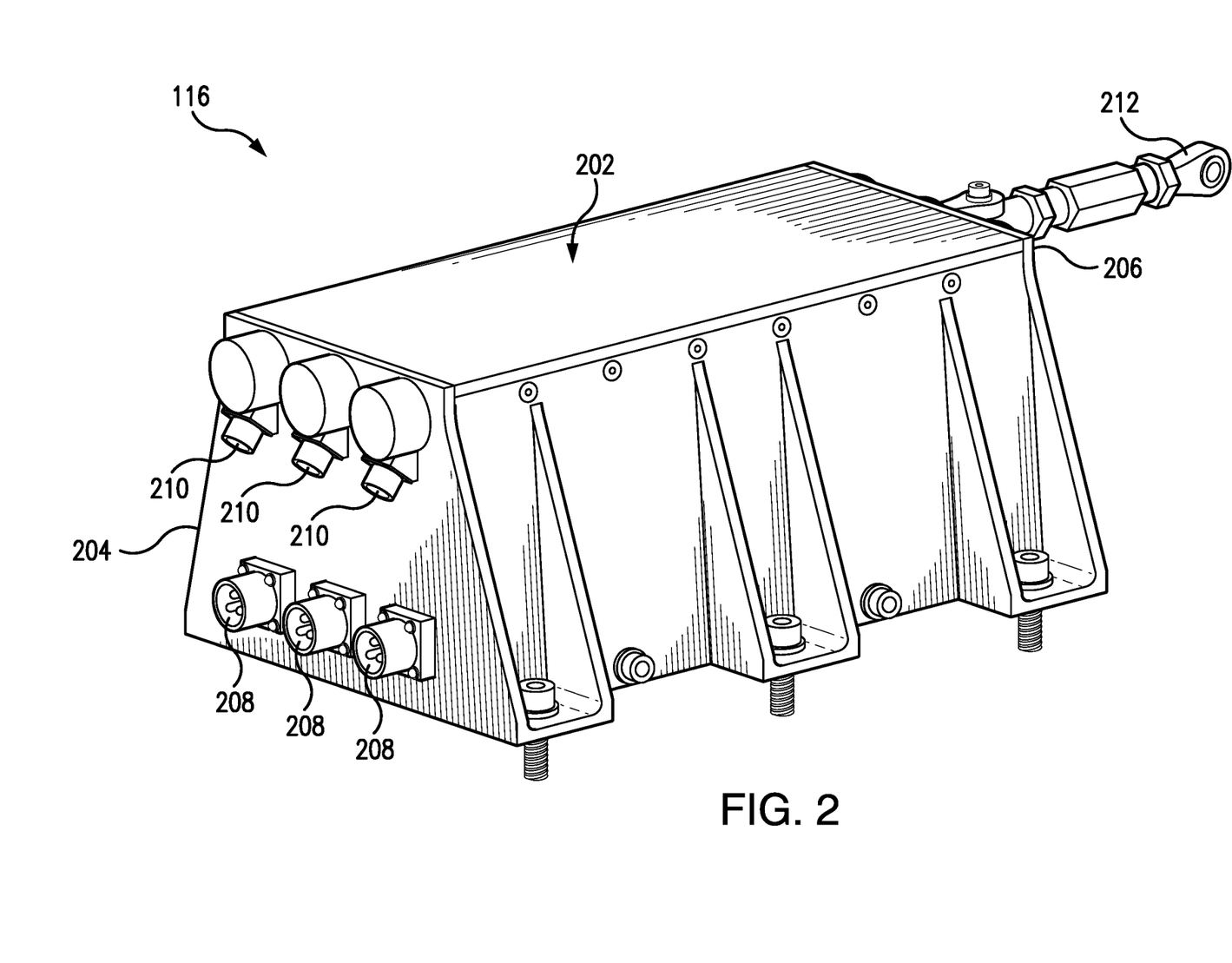
FIG. 2 is a perspective view of one of the actuators in the VTOL aircraft of FIG. 1, showing the actuator housing.
Figure 3:
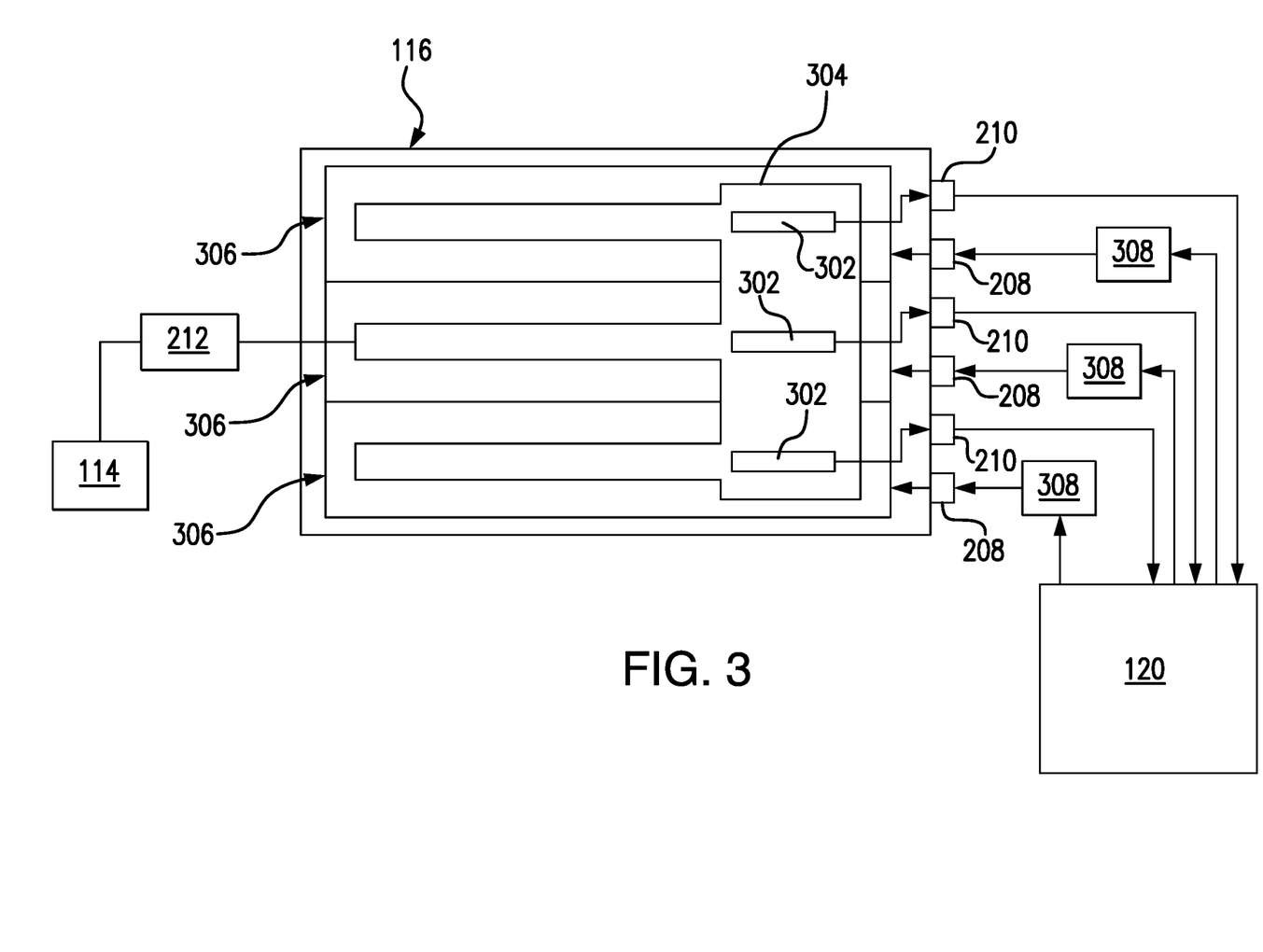
FIG. 3 is a schematic depiction of the actuator of FIG. 2, showing the connections between the signal connectors and electromechanical motor power connectors.

With reference now to FIGS. 2 and 3, actuator 116 includes a housing 202. Housing 202 includes a connector side 204 and a forcer rod side 206. Housing connector side 204 includes electromechanical motor power connectors 208 and signal connectors 210. Electromechanical motor power connectors 208 are operatively connected between an electromechanical motor drive 308, schematically shown in FIG. 3, and respective electromechanical motors 306, described below, to operatively connect electromechanical motors 306 to motor drive 308. Actuator 116 includes a plurality of linear variable differential transformers (LVDT) 302, e.g. a position sensor, to measure the absolute displacement of electromechanical motors 306. Signal connectors 210 operatively connect respective LVDTs 302 to flight control computer 120. Signal connectors 210 receive actuator position signals from each LVDT 302 and send them to flight control computer 120, which compares the true position of actuator 116 to the commanded position from the pilot.

As schematically shown in FIG. 3, signal connectors 210 each correspond to a respective LVDT 302. Each LVDT 302 is in electrical communication with flight control computer 120 through signal connectors 210 to convey the position of LVDTs 302 and carriage 304. The position of carriage 304 corresponds to a respective position of each one of electromechanical motors 306. As such, by monitoring the position of carriage 304 and LVDTs 302 through signal connectors 210, actuator controller and flight control computer 120 can appropriately adjust the power sent from electromechanical motor drives 308 to electromechanical motors 306 through motor power connectors 208 in order to achieve a desired position of carriage 304 along the longitudinal axis of actuator 116. The desired position of carriage 304 will depend on the input from the pilot or other control system. Those skilled in the art will readily appreciate that actuator 116 segregates three motor power connectors 208 and the three signal connectors 210, providing true redundancy between the systems, reducing the probability of failure due to a connector shorting out, or getting wet and losing connectivity.

Figure 4:
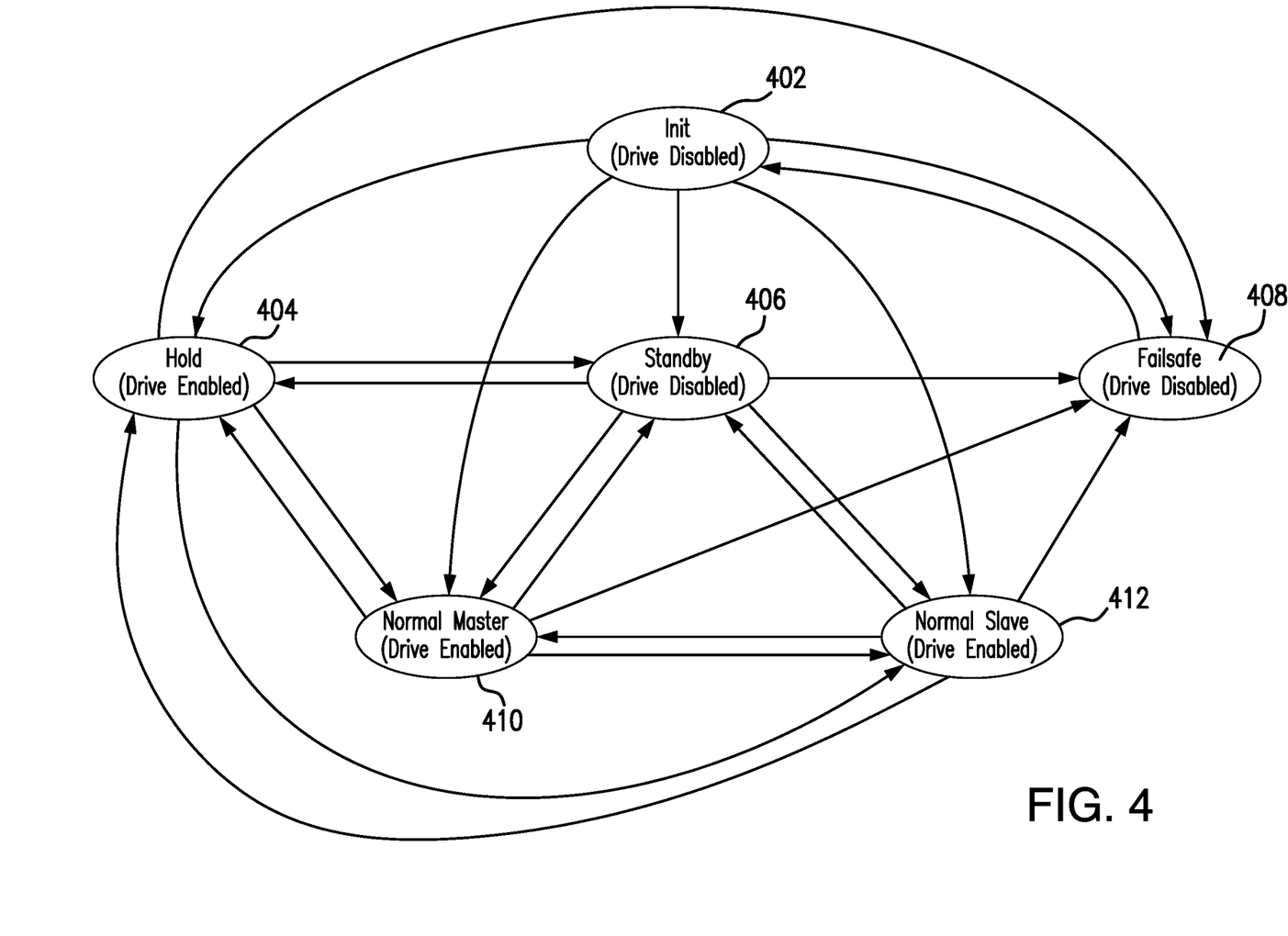
FIG. 4 illustrates an exemplary state diagram that specifies the operation of a multi-redundant actuator control system, in accordance with an embodiment of the present invention.

FIG. 4 illustrates various states and transitions supported by the disclosed multi-redundant actuator system. As shown in FIG. 4, the electromechanical motor may assume one of the following states/modes: Init 402, Hold 404, Standby 406, Failsafe 408, Normal Master 410 and Normal Slave 412. The establishment of "master" versus "slave" status is automatically optimized for each electromechanical motor to best meet the current operating conditions as can be best sensed and/or predicted by the motor units.

The Init mode 402 may run an initialization routine (initialization code) which enables the electromechanical motor 306 to communicate with the remaining electromechanical motors and with the FCC 120. Initialization code may be generated by a high-level language compiler into the embedded system programming. Electromechanical motor's drive is disabled in the Init mode 402.

Standby mode 406 is opposite of active modes (such as Normal modes 410, 412, for example). In other words, if a first electromechanical motor powers a flight surface for movement in response to commands from the FCC 120, a second electromechanical motor may be placed in Standby mode 406 by the FCC 120 to provide as little resistance to flight surface's movement as possible. Electromechanical motor's drive is disabled in the Standby mode 406.

An inoperable Failsafe mode 408 is also provided which is entered in the event a critical condition is detected by the system. Electromechanical motor's drive is disabled in the Failsafe mode 408 as well.

Three active modes are provided by the disclosed multi-redundant actuator system: Normal Slave mode 412, Normal Master mode 410 and Hold mode 404. The Master mode 410 is an operation mode for an electromechanical motor to maintain control of the multi-redundant actuator system. The electromechanical motor operating in the Master mode 410 can further control and manage other electromechanical motors operating in Slave mode 412. The Slave mode 412 is an operation mode for an electromechanical motor to allow the other electromechanical motor, operating in Master mode 410, to control and manage the system. If the electromechanical motor operating in Master mode 410 stops receiving commands from the FCC 120, it automatically transfers into the Hold mode 404 and holds its current position until a command is received from the FCC 120 or until another mode exit criteria are met, as discussed below.

According to embodiments of the present invention, the disclosed multi-redundant actuator system includes control logic configured to implement a set of rules. In an embodiment, according to the rule set, the system should have at least one electromechanical motor driving a control surface except for the following situations: a) FCC 120 sends disable signals to all electromechanical motors; b) all electromechanical motors are commanded by FCC 120 to transition to Standby mode 406 for more than persistence. It should be noted that if a particular electromechanical motor automatically transitions to Normal state 410, 412 and FCC 120 does not reciprocate with a normal mode command within a predefined number of communication cycles, then the electromechanical motor is configured to automatically transfer back to Standby mode 406.

According to another preconfigured rule of the disclosed multi-redundant actuator system, in a highly unlikely case of all electromechanical motors entering Normal state 410,412 at exactly the same time instance, the first electromechanical motor gets a priority for the "master" status. Once a particular electromechanical motor 306 gets a "master" designation, that electromechanical motor 306 stays in Master mode 410 until mode exit criteria are met. Advantageously, each autonomous motor 306 is configured to ignore FCC mode command and configured to automatically transition into Normal state 410, 412, in response to determining that no other electromechanical motor is currently driving the system. This functionality enables multi-redundant actuator control system's logic to substantially immediately transfer control to alternate electromechanical motor (in case of a failure of a driving "master" electromechanical motor), while waiting for the FCC 120 to reciprocate with Normal mode 410, 412 command. In this case, the designated "master" electromechanical motor stays in Normal mode 410, 412 for a predefined number of communication cycles, even if the FCC 120 commands this particular electromechanical motor to go to Standby mode 406. Advantageously, this functionality allows the FCC 120 to recognize the failure and react to the failure, for example, by commanding the proper mode to the remaining electromechanical motors. At least in some cases the FCC 120 may override the automatic mode selection for a particular electromechanical motor if needed.

If a critical fault associated with one of the electromechanical motors is detected or if the FCC 120 sends one of the electromechanical motors into Failsafe mode 408, that electromechanical motor gets a chance to automatically reset itself up to N number of times, where N is a pre-defined number. If the electromechanical motor 306 stops receiving commands from the FCC 120 and no other electromechanical motor is available, the electromechanical motor 306 is configured to automatically transfer into the Hold mode 404 and hold its current position. If the electromechanical motor 306 stops receiving commands from the FCC 120 and one or more other electromechanical motors are available, the electromechanical motor 306 is configured to automatically transfer into the Standby mode 406. Furthermore, the disclosed multi-redundant actuator system is configured to prioritize Normal modes 410, 412 over all other modes. The electromechanical motor 306 is configured to transition from Hold mode 404 to Normal mode 410, 412 only in response to receiving a valid command from the FCC 120. In addition, the electromechanical motor 306 is configured to transition from Hold mode 404 to Standby mode 406 if at least one of the plurality of electromechanical motors 306 is operating in one of the Normal modes 410, 412.

Figure 5:
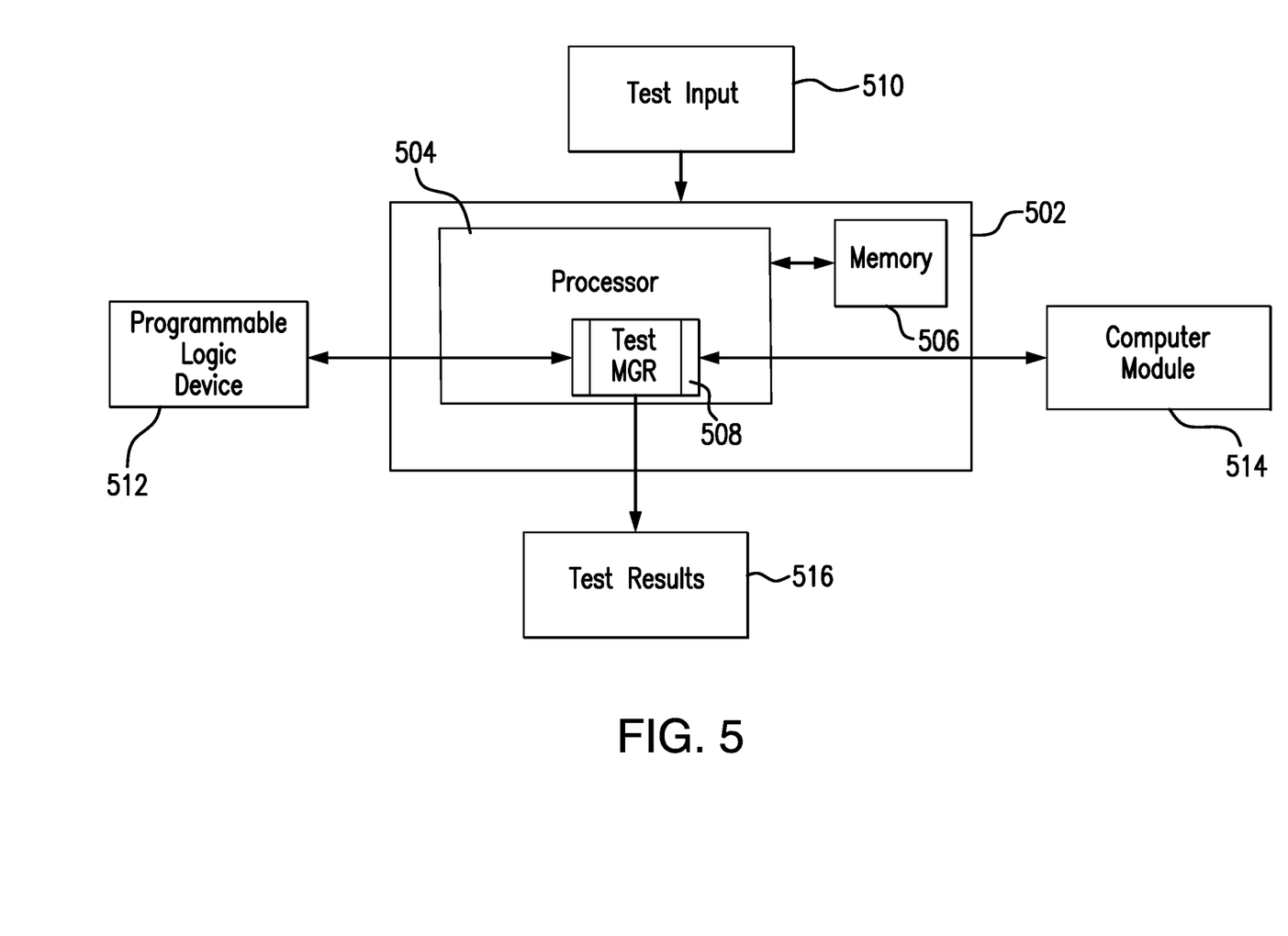
FIG. 5 illustrates components of a testing framework that might be used to test electromechanical actuators having autonomous reconfiguration logic, according to an embodiment of the present invention.

FIG. 5 illustrates components of a testing framework that might be used to test electromechanical actuators having autonomous reconfiguration logic, according to an embodiment of the present invention.

By way of example, a testing framework 500 may include a testing system 502 for providing a software developer, tester, quality assurance analyst or other user involved in the development of autonomous reconfiguration logic of electromechanical actuators with a means of readily updating or modifying test input data 510. As will be discussed further with respect to FIG. 6, the testing system 502 utilizes various instances of test input data 510, as maintained by the testing system 502 to generate updated test results 516, responsive to execution of a plurality of test cases against a computer model 514 and a programmable logic device 512. The test input data 510 may include a plurality of data items or instructions for testing and validating the behavior of specific features of electromechanical actuators as implemented by the autonomous reconfiguration logic. Also, the test input data 510 may be organized into one or more test suites, which may further encompass one or more test cases, for enabling a means of coordinated testing of the autonomous reconfiguration logic.

Each test suite may execute one or more test cases, which, in certain embodiments may be implemented as one or more scripts for executing the various steps associated with the specific function under test. A "test case" encompasses a set of conditions or variables that may be assessed by a tester to determine whether the autonomous reconfiguration logic under test is working correctly or not. The mechanism for determining whether the tested functionality has passed or failed could be based on observed execution of a requirement, an expected use case, or in other instances based on a predefined set of state validity rules. Hence, in certain embodiments, test cases may be implemented as a "test script" for automating requirement or use case execution, and made to pass one or more inputs (arguments) to the specific functions or states under test for generating a passing or failing behavioral response. Alternatively, the test steps can be stored in a word processor document, spreadsheet, database or other common repository.

For illustration purposes, a "test case" is to be taken to be synonymous with a "test script" when applied within the context of a test suite. Large test suites, and hence more complex test cases/scripts, may also contain prerequisite states, steps and descriptions. It is noted, therefore, that when implemented as a script, test cases may include various instructions for invoking the function or system state under test and may pass one or more test input data/arguments.

Still referring to FIG. 5, the exemplary testing system 502 may include a processing unit (CPU) 504 and a system bus (not shown) that couples various system components including a system memory 506 such as read only memory (ROM) and random access memory (RAM) to the processor(s) 504. The processor(s) 504 can include a cache of high-speed memory connected directly with, in close proximity to, or integrated as part of the processor(s) 504. These and other modules can control or be configured to control the processor(s) 504 via a plurality of instructions to perform various operations or actions described below. Other system memory may be available for use as well. The memory 506 can include multiple different types of memory with different performance characteristics. For economy of the description, only the CPU 504 and system memory 506 of the testing system 502 is explicitly shown in FIG. 5.

Functional testing of the autonomous reconfiguration logic is performed by a test manager module 508 configured and operable to interface with an externally accessible programmable logic device 512 and/or a computer model 514 of the testing framework 500. The test manager module 508 operates to autonomously execute a plurality of test cases. According to an embodiment of the present invention, test input data 510 combined with the plurality of test cases cover all possible operable and inoperable state combinations of the plurality of electromechanical motors, as described below in conjunction with FIG. 6.

According to embodiments of the present invention, the programmable logic device (PLD) 512 is configured and operable to implement in hardware the autonomous reconfiguration logic for the electromechanical actuator. PLDs, such as, for example, complex programmable logic devices (CPLDs) and field programmable gate arrays (FPGAs), utilize various types of memory to store their configuration data, which defines the functionality of the PLD. For example, CPLDs generally employ electrically erasable complementary metal oxide semiconductor (EECMOS) technology, which is non-volatile but can be programmed (e.g., receive and store data) only a limited number of times and takes longer to program than some other types of memory (e.g., static random access memory (SRAM)). CPLDs typically provide numerous benefits, such as fast, predictable timing and single-level, wide-logic support.

As another example, FPGAs typically provide benefits, such as high logic density and low standby power and generally utilize SRAM technology. SRAM is infinitely reconfigurable, but loses its programming upon power loss (i.e., volatile memory) and generally requires an external non-volatile source to supply it with configuration data upon power-up.

In various embodiments the PLD 512 may be implemented as one or more application specific integrated circuits (ASICs), digital signal processors (DSPs), digital signal processing devices (DSPDs), FPGAs, soft core processors, hard core processors, controllers, micro-controllers, microprocessors, other electronic units designed to implement in hardware the functionality of autonomous reconfiguration logic.

According to embodiments of the present invention, the computer model 514 is configured and operable to implement in software the autonomous reconfiguration logic for the electromechanical actuator. In one embodiment, the computer model 514 may be programmed to perform certain routines simulating the operation of a multi-redundant actuator control system and programmed to observe the designated motor's response. In other words, routines are configured to test pre-selected motors, where each test is designed to elicit a particular response. Failure to respond in the expected manner causes the routine to return an error code indicating that the actuator/motor tested failed and that there exists a system fault with regard to that actuator/motor. Such error codes may be included in the generated test results 516 reported to a user.

Figure 6:
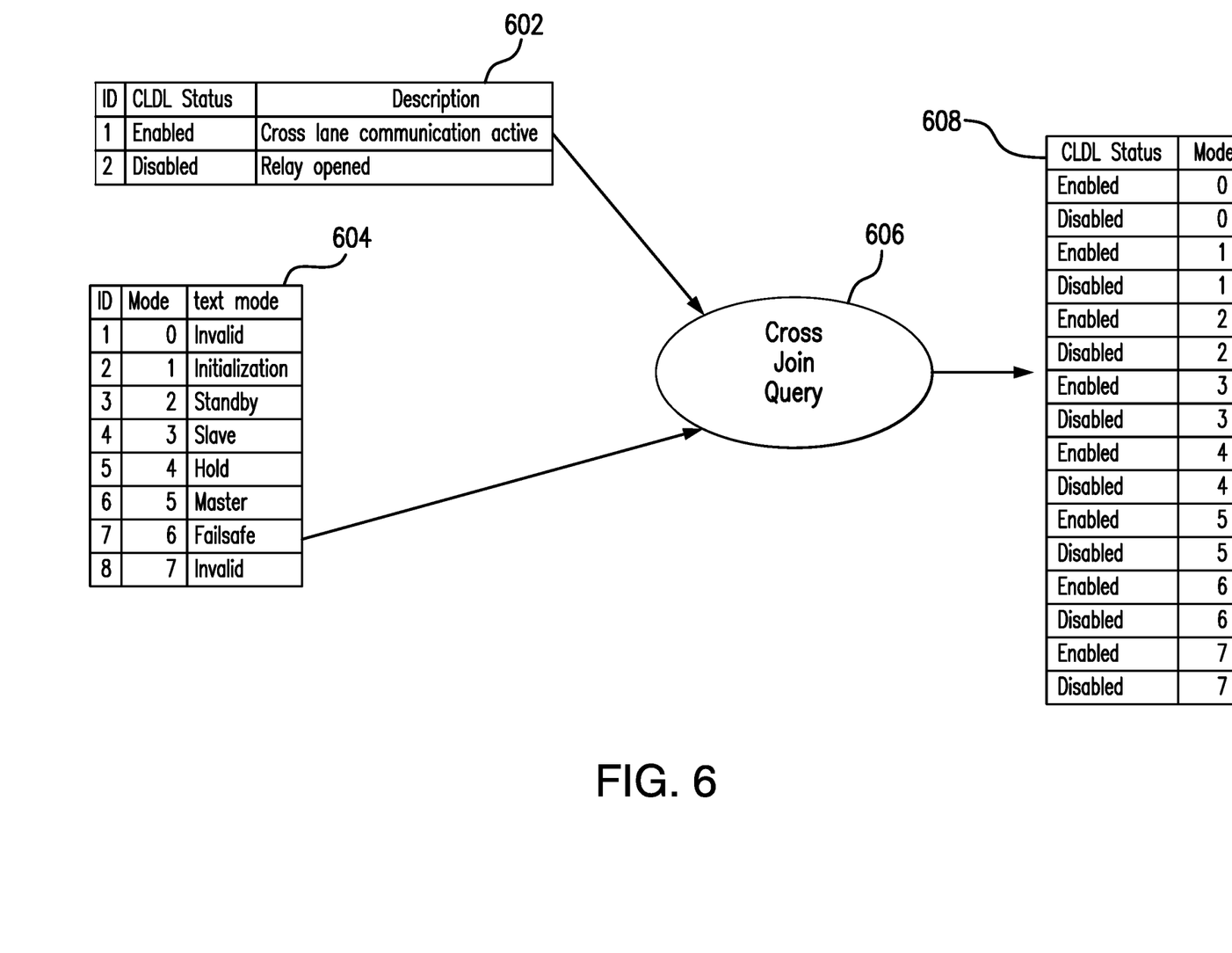
FIG. 6 illustrates exemplary test input data that can be used to test electromechanical actuators having autonomous reconfiguration logic, according to an embodiment of the present invention.

FIG. 6 illustrates exemplary test input data that can be used to test electromechanical actuators having autonomous reconfiguration logic, according to an embodiment of the present invention. In one embodiment, test input data 510 may be stored in a database as a plurality of tables. Each of the tables may include information that may be used by the test manager module 508 to test the autonomous reconfiguration logic. As shown in FIG. 6, a first exemplary test input table 602 may include all possible states of cross lane data links (between the plurality of electromechanical motors). In this case, the first table includes only two possible states—enabled and disabled. A second exemplary test input table 604 includes all possible states/modes that may be assumed by the electromechanical motor, such as, but not limited to Init 402, Hold 404, Standby 406, Failsafe 408, Normal Master 410 and Normal Slave 412 states described above.

According to an embodiment of the present invention, the test manager module 508 may be configured to query the tables 602, 604 via one or more cross join queries 606 to retrieve data for a particular test suite. Standard database access methods support data retrieval operations using high-level query languages, such as the Structured Query Language (SQL). The term "query" denominates a set of commands that cause execution of operations for processing data from a stored database. The cross join query 606 returns a Cartesian product result set. A Cartesian product is an operation between two result sets forming a single query result. For instance, assume that upon execution of a given query 606 against first and second databases 602 and 604, respectively, a first result set RS1 is determined from the first table 602 and a second result set RS2 is only a subset of data retrieved from the second table 604. Assume further that RS1={Enabled, Disabled} and that RS2={0, 1}. In order to return both result sets in the form of a single query result, the Cartesian Product of RS1 and RS2 is determined. This is an operation that is performed to return a single query result consisting of all tuples of values read out from both result sets, i.e., RS1×RS2={Enabled,Disabled}×{0, 1}={<Enabled, 0>, <Enabled, 1>, <Disabled, 0>, <Disabled, 1>}. In other words, the Cartesian Product RS1×RS2 can be generated by arranging every element of RS1 and RS2 with a double loop structure, generating and registering each tuple of elements, and adding each tuple to the single query result.

In FIG. 6, a third table 608 represents the Cartesian Product of the first 602 and second 604 tables. For economy of the description, only two input tables 602 and 604 of the test input data 510 are explicitly shown in FIG. 6. Other input tables may contain any data related to an input to the Unit Under Test (UUT). Such data may include, for example, input power levels (i.e. 0V, 28V, 33V), status states of other system devices, communication bus faults, and the like. Typically there should be a separate table for each input into the autonomous reconfiguration logic. For example, if the autonomous reconfiguration logic is based off power state, a ground/open discrete, FCC mode, and temperature there would exist a table for each item containing all possible states of that input. The third table 608 represents a plurality of test cases to be executed by the test manager module 508. If all input tables are cross joined by the cross join query 606 then the third table 608 would include all possible combinations of inputs for the autonomous reconfiguration logic. It should be noted that due to complexity of the autonomous reconfiguration logic, the third table 608 may include millions of test cases in this scenario.

Figure 7:
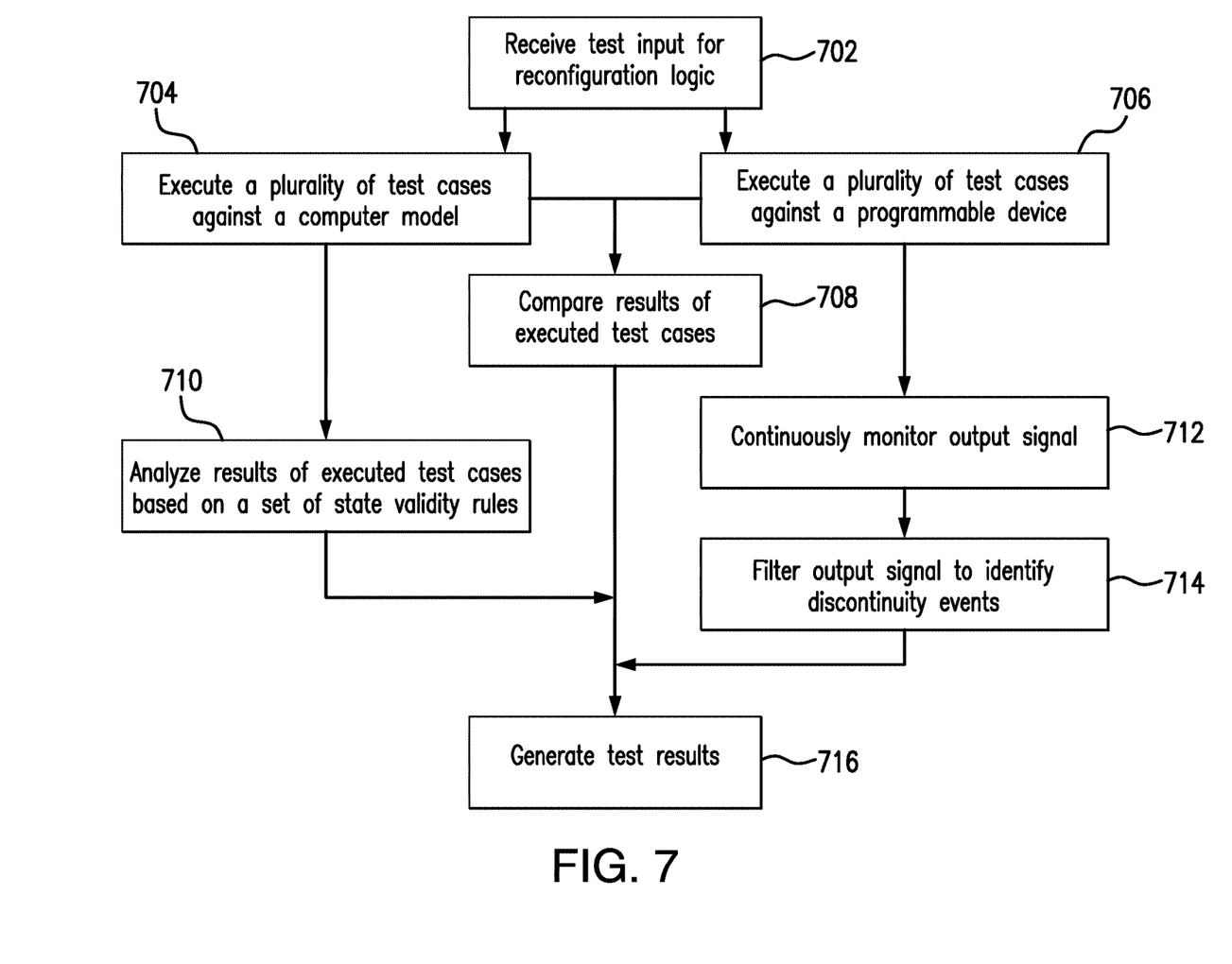
FIG. 7 is a flowchart illustrating operation of an embodiment of the present invention.

FIG. 7 is a flowchart illustrating operation of an embodiment of the present invention. Before turning to description of FIG. 7, it is noted that the flow diagram shown therein is described, by way of example, with reference to components shown in FIGS. 1-6 and 8A-8C, although these operational steps may be carried out in any system and are not limited to the scenario shown in the aforementioned figure. Additionally, the flow diagram in FIG. 7 illustrates an example in which operational steps are carried out in a particular order, as indicated by the lines connecting the blocks, but the various steps shown in this diagram can be performed in other order, or in any combination or sub-combination. It should be appreciated that in some embodiments some of the steps described below may be combined into a single step. In some embodiments, one or more additional steps may be included.

At step 702, the test manager module 508 retrieves the test input 510 for the autonomous reconfiguration logic, for example, by executing the cross join query 606. As noted above, the test input 510 may comprise all entries stored in the third table 608. The third table 608 contains the result set of the cross join query 606. In some embodiments, the test input 510 may include all possible combinations of inputs for the autonomous reconfiguration logic. Upon retrieving the test input 510, the test manager module 508 passes it to both the PDL 512 and the computer model 514. At step 704, the test manager module 508 executes a plurality of test cases against the computer model 514. As noted above, the computer model 514 is configured and operable to implement in software the autonomous reconfiguration logic for the electromechanical actuator In other words, the computer model 514 may be programmed to perform certain routines simulating the operation of a multi-redundant actuator control system and programmed to observe the designated motor's response. For each test case, failure to respond in the expected manner causes the computer model 514 to return an error code indicating that the actuator/motor tested failed and that there exists a system fault with regard to that actuator/motor. Furthermore, as each test case is being executed, the test manager module 508 continuously monitors the transitions between logic states assumed by each of the electromechanical motors and, monitors system outputs and compares them against each other. According to an embodiment of the present invention, the test manager module 508 completes step 704 by generating a first set of test results.

According to an embodiment of the present invention, at step 710, the test manager module 508 analyzes the first set of test results based on a set of state validity rules. The set of state validity rules may comprise a number of different rules in various embodiments. Some state validity rules may be defined to check, for example, that none of the simulated operations resulted in an error, or that the projection of the time taken to perform an operation does not exceed a threshold value. In other words, such state validity rules may be utilized by the test manager module 508 to identify race conditions and other system specific errors such as multiple lanes in control. Indications of the results of some or all of the operations (e.g., whether the operation succeeded or failed, return values or outputs generated as a result of the autonomous reconfiguration logic operation simulation) may be collected and/or stored in some embodiments.

According to some embodiments, step 706 may be performed by the test manger module 508 in parallel with the step 704. At step 706, the test manager module 508 executes a plurality of test cases against the PLD 512. As noted above, the PLD 512 may be implemented as one or more application specific integrated circuits (ASICs), digital signal processors (DSPs), digital signal processing devices (DSPDs), FPGAs, soft core processors, hard core processors, controllers, micro-controllers, microprocessors, other electronic units designed to implement in hardware the functionality of autonomous reconfiguration logic. Similarly to step 704, as each test case is being executed, the test manager module 508 continuously monitors the transitions between logic states assumed by each of the electromechanical motors and monitors system outputs and compares them against each other. According to an embodiment of the present invention, the test manager module 508 completes step 706 by generating a second set of test results. At step 708, the test manager module 508 may compare the first set of test results to the second set of test results to identify any discrepancies. It should be noted that parallel execution of steps 704 and 706 is preferable, so that comparison step 708 can be performed after each executed test case, rather than waiting until all test cases have executed to process the data and find faults. In many cases a failure in one test case due to a logic or system problem will cascade into other test cases and it is better to find the problem in real time to stop the execution of the remaining test cases, if necessary.

Figure 8A:
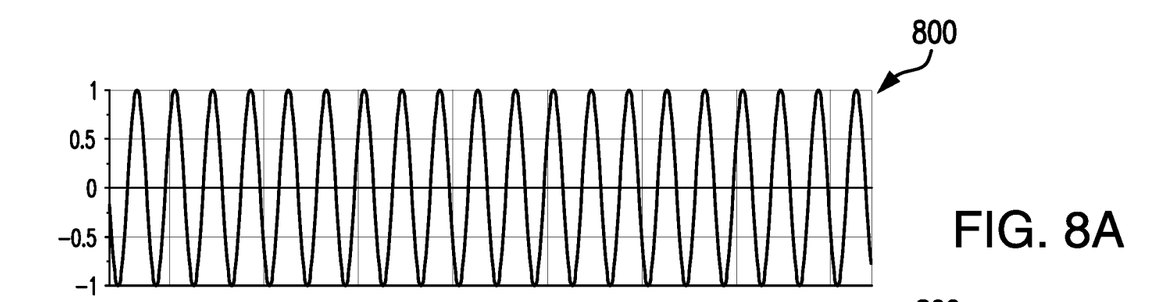
FIGS. 8A-8C illustrate steps that may be performed by the testing framework to monitor and filter test output signals in order to identify discontinuity events, in accordance with an embodiment of the present invention.

As the plurality of cases being executed against the PLD 512, the test manager module 508 continuously monitors output signal generated by the PLD 512 (step 712), as shown in FIG. 8A. In an embodiment of the present invention, the monitored signal may be a physical signal (e.g., converted voltage of the Linear Variable Differential Transformer (LVDT)). This signal may be monitored and recorded to a file by a data acquisition tool built into the testing system 502. The file is then processed by the test manager module 508 to filter the signal, as described below. In some embodiments a hardware circuit may be used to accomplish similar results. Suitable formats for the generation of the output signal file include: Microsoft Excel .xls, text .txt, tab separated text .ttx, separated values .csv, XML, and any other format that can store two vectors of data (time, signal). At step 714, the test manager module 508 passes the output signal through a high pass filter to identify one or more discontinuity events, as described below in conjunction with FIGS. 8A-8C. At step 716, the test manager module 508 combines outcomes of steps 708, 710 and 714 to generate the updated test results 516. In various embodiments, the test manager module 508 may deliver the updated test results 516 to a user via a user interface or as a report file, for example.

Figure 8B:
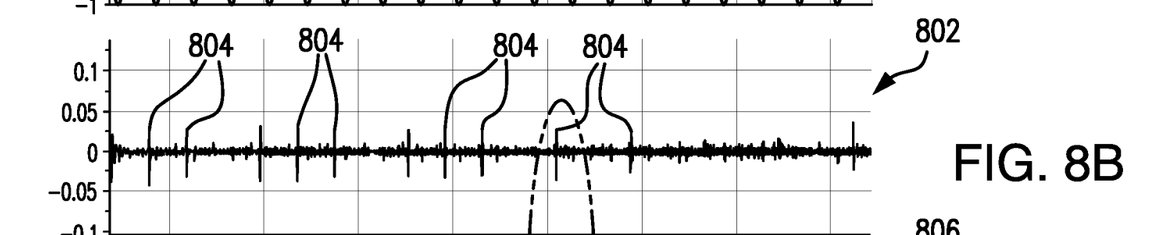
Figure 8C:
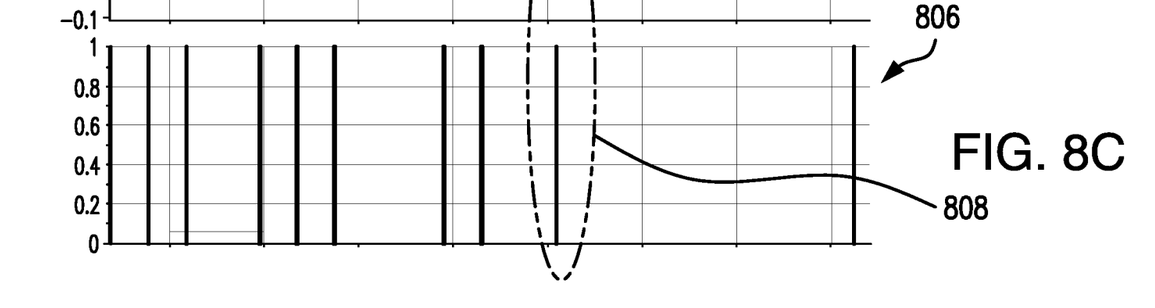

FIGS. 8A-8C illustrate steps that may be performed by the testing framework to monitor and filter test output signals in order to identify discontinuity events, in accordance with an embodiment of the present invention. More specifically, FIG. 8A depicts an exemplary characteristic curve 800 of the expected output signal. As noted above, at step 714, the test manager module 508 filters out the received output signal to identify discontinuity events. FIG. 8B depicts an exemplary curve 802 of the filtered out signal where the expected signal is removed. This curve 802 includes peaks and valleys, where peaks 804 are associated with the discontinuity events. Each discontinuity event 804 represents faulty transitions between system configurations (e.g., non-compliant transitions between different states assumed by corresponding electromechanical motors). FIG. 8C depicts the discontinuity events 808 in an exclusive fashion.

In summary, various embodiments of the present invention are directed to verification of complex autonomous reconfiguration logic of a multi-redundant actuator control system. The redundant electromechanical motors communicate with each other to determine which one is in control (master mode) and which electromechanical motors slave to the master (slave mode). Advantageously, embodiments of the present invention provide a testing framework and methodology capable of performing a plurality of comprehensive fully automated test cases to verify the proper functionality and timing of autonomous reconfiguration logic implemented by the multi-redundant actuators. The testing framework can be easily reconfigured when one or more test inputs are added, removed or changed. Furthermore, the disclosed testing framework improves repeatability, by automatically generating and executing test cases and by analyzing test output data associated with various functions of the autonomous reconfiguration logic under test.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages that can be converted to a machine language. The program code may also be written in a Hardware Descriptor Language (HDL). HDLs are frequently used to specify circuit designs for an integrated circuit (IC), such as a field programmable gate array (FPGA), application specific integrated circuit (ASIC), or the like. An electronic design automation (EDA) tool compiles HDL code specifying a circuit design for implementation in a target IC. Example HDLs include Verilog, SystemVerilog, and VHDL.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for testing autonomous reconfiguration logic for an electromechanical actuator, the method comprising:
   executing a plurality of test cases against a computer model configured and operable to implement autonomous reconfiguration logic for an electromechanical actuator comprising a plurality of electromechanical motors to generate a first set of test results, wherein the autonomous reconfiguration logic comprises a plurality of programming instructions to autonomously and automatically configure a control state of the plurality of electromechanical motors for implementing redundancy of the electromechanical motors;
   executing the plurality of test cases against a programmable logic device configured and operable to implement the autonomous reconfiguration logic for the electromechanical actuator to generate a second set of test results; and
   comparing the first set of test results to the second set of test results.

2. The method of claim 1, wherein the autonomous reconfiguration logic comprises a plurality of programming instructions to automatically configure the electromechanical actuator for optimal control state based on operating status information of at least one of the plurality of electromechanical motors.

3. The method of claim 2, wherein the control state comprises one of the following: init, hold, standby, failsafe, master and slave.

4. The method of claim 1, wherein the plurality of test cases comprises all possible operable and inoperable state combinations of the plurality of electromechanical motors.

5. The method of claim 1, further comprising continuously monitoring an output signal generated by the programmable logic device during execution of the plurality of test cases against the programmable logic device.

6. The method of claim 5, further comprising filtering the generated output signal to identify one or more signal discontinuity events.

7. The method of claim 1, further comprising analyzing the first set of test results based on a predefined set of state validity rules.

8. The method of claim 1, wherein the programmable logic device comprises one of a field programmable gate array (FPGA), application specific integrated circuit (ASIC), digital signal processor (DSP), digital signal processing device (DSPD), soft core processor, hard core processor.

9. The method of claim 1, further comprising testing substantially all execution paths through the autonomous reconfiguration logic to test functionality and timing of the autonomous reconfiguration logic.

10. A system for testing autonomous reconfiguration logic for an electromechanical actuator, the system comprising:
    a computer model configured and operable to implement autonomous reconfiguration logic for an electromechanical actuator comprising a plurality of electromechanical motors, wherein the autonomous reconfiguration logic comprises a plurality of programming instructions to autonomously and automatically configure a control state of the plurality of electromechanical motors for implementing redundancy of the electromechanical motors;
    a programmable logic device configured and operable to implement the autonomous reconfiguration logic for the electromechanical actuator; and
    a processor communicatively coupled to the computer model and the programmable logic device, the processor configured and operable to:
      execute a plurality of test cases against the computer model to generate a first set of test results;
      execute the plurality of test cases against the programmable logic device to generate a second set of test results; and
      compare the first set of test results to the second set of test results.

11. The system of claim 10, wherein the autonomous reconfiguration logic comprises a plurality of programming instructions to automatically configure the electromechanical actuator for optimal control state based on operating status information of at least one of the plurality of electromechanical motors.

12. The system of claim 11, wherein the control state comprises one of the following: init, hold, standby, failsafe, master and slave.

13. The system of claim 10, wherein the plurality of test cases comprises all possible operable and inoperable state combinations of the plurality of electromechanical motors.

14. The system of claim 10, wherein the processor is further configured and operable to continuously monitor output signal generated by the programmable logic device during execution of the plurality of test cases against the programmable logic device.

15. The system of claim 14, wherein the processor is further configured and operable to filter the generated output signal to identify one or more signal discontinuity events.

16. The system of claim 10, wherein the processor is further configured to analyze the first set of test results based on a predefined set of state validity rules.

17. The system of claim 10, wherein the programmable logic device comprises one of a field programmable gate array (FPGA), application specific integrated circuit (ASIC), digital signal processor (DSP), digital signal processing device (DSPD), soft core processor, hard core processor.

18. The system of claim 10, wherein the autonomous reconfiguration logic comprises a plurality of programming instructions to test substantially all execution paths through the autonomous reconfiguration logic to test functionality and timing of the autonomous reconfiguration logic.

* * * * *